United States Patent
Reis et al.

(10) Patent No.: US 7,536,616 B2
(45) Date of Patent: May 19, 2009

(54) JTAG TESTING ARRANGEMENT

(75) Inventors: Ilkka Reis, Tampere (FI); Mikko Simonen, Tampere (FI)

(73) Assignee: Patria Advanced Solutions Oy, Tampere (FI)

( * ) Notice: Subject to any disclaimer, the term of this patent is extended or adjusted under 35 U.S.C. 154(b) by 319 days.

(21) Appl. No.: 10/536,024

(22) PCT Filed: Nov. 20, 2003

(86) PCT No.: PCT/FI03/00893

§ 371 (c)(1),
(2), (4) Date: Mar. 31, 2006

(87) PCT Pub. No.: WO2004/046741

PCT Pub. Date: Jun. 3, 2004

(65) Prior Publication Data

US 2006/0206280 A1    Sep. 14, 2006

(30) Foreign Application Priority Data

Nov. 21, 2002   (FI) ............................... 20020469 U

(51) Int. Cl.
*G01R 31/28*   (2006.01)
(52) U.S. Cl. ........................ 714/727; 714/724; 714/726; 703/23
(58) Field of Classification Search .................. 714/727
See application file for complete search history.

(56) References Cited

U.S. PATENT DOCUMENTS

| | | | |
|---|---|---|---|
| 5,983,017 A | 11/1999 | Kemp et al. | |
| 6,418,545 B1 | 7/2002 | Adusumilli | |
| 6,807,644 B2* | 10/2004 | Reis et al. | 714/724 |
| 6,947,884 B2* | 9/2005 | Swoboda | 703/28 |
| 7,017,081 B2* | 3/2006 | Gomez | 714/30 |
| 7,149,927 B2* | 12/2006 | Stancil | 714/31 |
| 7,401,257 B2* | 7/2008 | Usui | 714/27 |
| 7,444,546 B2* | 10/2008 | Kimelman et al. | 714/31 |
| 2001/0034598 A1* | 10/2001 | Swoboda | 703/26 |
| 2001/0042237 A1 | 11/2001 | Chang et al. | |
| 2002/0002442 A1* | 1/2002 | Rivin et al. | 702/186 |
| 2002/0035721 A1* | 3/2002 | Swoboda | 717/4 |
| 2002/0049558 A1* | 4/2002 | Reis et al. | 702/122 |
| 2002/0089883 A1* | 7/2002 | Pepi et al. | 365/200 |
| 2002/0124216 A1* | 9/2002 | Blasco Allue et al. | 714/726 |
| 2002/0141487 A1* | 10/2002 | Bradley | 375/148 |
| 2003/0224828 A1 | 12/2003 | Ylitalo | |
| 2004/0064764 A1* | 4/2004 | Gomez | 714/47 |

FOREIGN PATENT DOCUMENTS

| | | |
|---|---|---|
| EP | 1189070 | 3/2002 |
| WO | WO 03/076719 | 9/2003 |

* cited by examiner

*Primary Examiner*—Cynthia Britt
*Assistant Examiner*—Steven D Radosevich
(74) *Attorney, Agent, or Firm*—Young & Thompson

(57) ABSTRACT

JTAG test equipment arranged to establish an asynchronous data transmission connection with a JTAG-compatible device under test for the transmission of test data between test access ports (TAP) in the test equipment and device under test. The test data is synchronized at reception before the test access ports (TAP). The test equipment includes a computer program for adapting a test data sequence arriving in the format defined by the test access port for transmission on an asynchronous transmission path, and a transceiver (TR1) for adapting the test data sequence and transmitting it through the asynchronous data transmission connection to the device under test.

7 Claims, 1 Drawing Sheet

PRIOR ART

JTAG TESTING ARRANGEMENT

FIELD OF THE INVENTION

The invention relates to JTAG testing, and more particularly to widening the field of application of JTAG testing.

BACKGROUND OF THE INVENTION

A general-purpose standard IEEE 1149.1, also known as JTAG (Joint Test Action Group) according to the consortium that prepared the standard, has been created for testing different circuit boards and components and integrated circuits connected thereto. JTAG is a boundary scan method, in which an input signal is fed into a boundary pin of a circuit board and an output signal is measured from another boundary pin. The basic idea of JTAG is to transfer predetermined data sequences in series through IC components in a circuit board or in a part thereof and to sample the output data. As the topology and logical functions of the components of the circuit board to be tested are known in advance, an assumed output can also be determined. Test equipment may be used to compare the output data of a device under test DUT with the assumed output and if they correspond with one another, the device under test DUT operates correctly. If, in turn, the output data does not correspond with the assumed output, the tested circuit may be open, an outside signal may be connected thereto, or a component in the circuit may be defective. In such a case, the defect can typically be determined by running different test data sequences through the device under test and by analysing the obtained output using software included in the test equipment.

The JTAG standard determines for both the test equipment comprising a JTAG controller and the device under test DUT an identical test access port TAP interface, with a fixed synchronous line between them comprising at least five conductors for five compulsory signals: a test clock signal TCK, test mode select signal TMS, test data input TDI, test data output TDO and ground reference signal GND. Patent application EP 1,189,070 of the applicant describes a solution for avoiding the use of the fixed synchronous line between the test equipment and the device being tested, which widens the use of JTAG testing significantly. The solution described in the patent application is based on using in both the test equipment and the device under test DUT transceivers that adapt signals coming from the test access port TAP for transmission through an asynchronous transmission path in such a manner that received signals can again be synchronized in the format required by the test access port TAP. This type of solution enables the use of a wireless asynchronous transmission path in the transmission of test data, whereby it is for instance possible to test circuit boards and analyse faults with the test equipment by telecontrol without a fixed connection to the device being tested. Correspondingly, the solution makes it possible for instance to test circuit boards that are at a distance from each other by using telecontrol over the Internet.

A problem then arises in a situation, in which several simultaneous test processes need to be performed with the test device, but in which only one asynchronous connection (a radio link or a single Ethernet cable, for example) is available. Such a situation may occur for instance in testing a telecommunications satellite in orbit, when not only the number of asynchronous connections established for testing but also the time used for testing needs to be minimized. In the solution of EP 1,189,070, this type of testing arrangement would require that the test equipment have its own TAP interface and transmitter for each testing process, the test data of which should further be adapted to one transmission path. This makes the implementation of the test equipment heavy and expensive, and in addition to this, the adaptation of the test data of several testing processes on the same transmission path complicates the implementation of the uplink interface significantly.

Correspondingly, a problem also arises in a situation, in which one piece of test equipment is used in various tests over asynchronous connections utilizing different data transmission protocols. In the solution of EP 1,189,070, each data transmission protocol requires a transmitter of its own to adapt the test data to the used protocol. In this case, too, hardware implementation becomes complex and expensive.

BRIEF DESCRIPTION OF THE INVENTION

It is thus an object of the invention to develop a system and equipment in such a manner that the above-mentioned problems are solved.

The invention is based on the idea that the JTAG test equipment comprises means implemented as a computer program for the adaptation of at least one test data sequence to be transmitted in the format defined by said test interface over an asynchronous transmission path, and a transceiver for the adaptation and transmission of said at least one test data sequence over the asynchronous data transmission connection to a device being tested.

According to a preferred embodiment of the invention, said means for the adaptation of the test data sequence for transmission over the asynchronous transmission path are implemented by a modular program, in addition to which said test equipment comprises means implemented by a modular program for controlling JTAG testing and means implemented by a modular program for generating a JTAG test data sequence and for analyzing a received test data sequence. The interface between the software controlling a boundary scan test and the JTAG controller software is reconfigurable.

The test equipment and system of the invention provide significant advantages. The arrangement of the invention makes it possible to reduce the number of required hardware components and to significantly simplify the testing equipment. Because both the software controlling the boundary scan test and the JTAG controller software are modular and the interface between them is configurable, it is, when necessary, possible to use a JTAG controller of the prior art that can preferably be connected to the testing arrangement only by re-defining the interface. A further advantage is that because the modification of the test data TDI to be transmitted to the format required by the asynchronous transmission path and the synchronization and adaptation of the received test data output TDO to the format according to the JTAG standard are performed by software, an unnecessary sampling of the data signals and their conversion into the format required by the TAP interface is avoided. Yet another advantage is that several testing processes can easily be run at the same time in the processors of the test device and the resulting test data can be adapted for transmission through one transmitter to one transmission path without complicating the implementation of the uplink interface.

BRIEF DESCRIPTION OF THE FIGURES

The invention will now be described in greater detail by means of preferred embodiments and with reference to the attached drawings, in which.

DETAILED DESCRIPTION OF THE INVENTION

Figure 1:
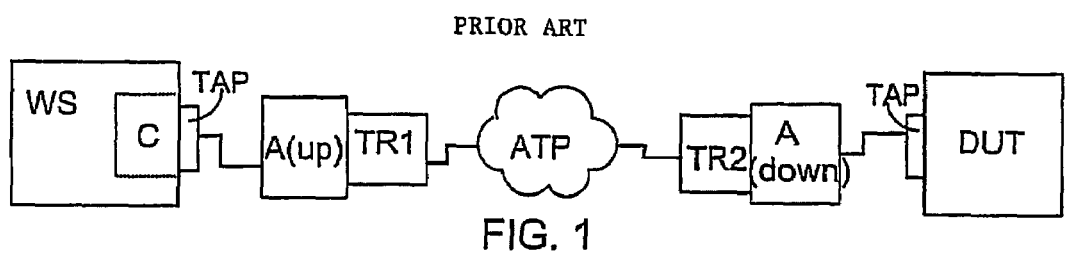
FIG. 1 is a block diagram illustrating an arrangement of the prior art for the use of an asynchronous transmission path in JTAG testing.

FIG. 1 shows the arrangement of the prior art described in EP 1,189,070 for testing a device under test DUT with test equipment in a JTAG controller. The testing arrangement comprises a workstation WS and a JTAG controller C connected functionally thereto. The workstation typically comprises software that controls the running of a boundary scan test performed at each time. The JTAG controller C in turn forms the JTAG test vectors used in the testing and transmits them to the TAP interface and correspondingly receives from the TAP interface the test vectors coming from the device under test DUT. At least a test mode select signal TMS and a test data input TDI are formed on the TAP interface of the JTAG controller C for transmission to the device under test DUT. On the side of the transmission path of the JTAG controller's C TAP interface, an uplink adapter A(up) is arranged to adapt the test data TDI to be transmitted and the test mode select signal TMS into the format used on the asynchronous transmission path. The modified test data is transmitted from the adapter A(up) to a transceiver TR1 that transmits the test data through the asynchronous transmission path ATP to the device under test DUT.

Correspondingly, on the side of the TAP interface transmission path of the device under test DUT, there is also a transceiver TR2 that receives test data signals from the asynchronous transmission path ATP and transmits them to a downlink adapter A(down) which in turn synchronizes the received signals to a format required by the TAP interface definition, thereby forming both the test mode select signal TMS and the test data input TDI. In addition to this, the downlink adapter A(down) generates a clock signal TCK by means of the received test mode select signal TMS and test data input TDI. The test data output TDO from the device under test is synchronized and adapted in the downlink adapter A(down) for transmission through the transceiver TR2 over the asynchronous transmission path ATP to the transceiver TR1. The uplink adapter A(up) connected to the JTAG controller of the test equipment synchronizes the test data output TDO received from the device under test DUT with the test data input TDI as required by the TAP interface.

As is apparent on the basis of what is described above, this type of solution has drawbacks for instance in situations, in which there is a need to perform several simultaneous test processes on the test device, but there is only one asynchronous connection available. This type of testing arrangement requires that the test equipment have a TAP interface, adapter and transmitter connected thereto for each testing process. This increases the number of components and subassemblies, which makes the implementation of the test equipment heavy and expensive. In addition, the adaptation of the test data of several testing processes for the same transmission path complicates the implementation of the uplink interface significantly.

Figure 2:
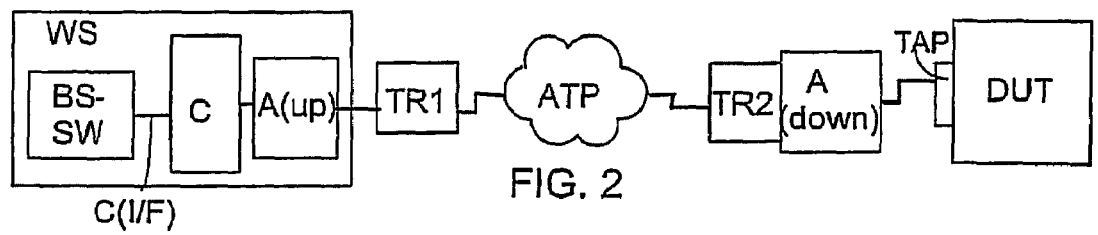
FIG. 2 is a block diagram illustrating an arrangement of the invention for the use of an asynchronous transmission path in JTAG testing.

Equipment has now been created to solve this problem. The testing arrangement of the invention is illustrated by means of FIG. 2. In respect of the testing arrangement of the prior art, modifications are only made on the test equipment side, in which case the modifications preferably do not affect the operation of the device under test DUT and the parts (downlink adapter A(down), transceiver TR2) connected thereto. The test equipment of the invention is preferably entirely implemented to a workstation WS in such a manner that both the JTAG controller C and the uplink adapter A(up) are implemented by modular software that together with the software BSSW controlling the boundary scan testing and residing in the workstation, when run in the processors of the workstation, adapt the test data TDI to be transmitted and the test mode select signal TMS to the format used on the asynchronous transmission path. In addition, corresponding pieces of software synchronize the test data TDO received from the device under test DUT with the test data input TDI in a manner to be described later on.

Thus all functions specifically related to JTAG testing can preferably be arranged to be executed by software, which reduces the number of required hardware components and simplifies the testing equipment significantly. Both the software BSSW controlling the boundary scan testing and the JTAG controller software C are modular and the interface C(I/F) between them is configurable. It is thus, if necessary, possible to use a JTAG controller of the prior art in the arrangement, which can preferably be connected to the testing arrangement only by redefining the interface C(I/F). Since the modification of the test data TDI to be transmitted to the format required by the asynchronous transmission path and the synchronization and adaptation of the received test data TDO to the format according to the JTAG standard is done by software, an unnecessary sampling of the data signals and their conversion to the format required by the TAP interface is avoided. Because the adaptation of the test data for the asynchronous transmission path is done by software, several testing processes can easily be run at the same time in the processors of the test device and the resulting test data can be adapted for transmission through one transmitter to the same transmission path without complicating the implementation of the uplink interface.

The following describes by way of example an assembly comprising a computer PC and JTAG testing software arranged functionally thereto and test data adaptation software, an Ethernet adapter serving as a transceiver, and a device under test similar to the one described above comprising a downlink adapter and transceiver as parts connected thereto. An Ethernet network is used as the asynchronous transmission path in this example.

The software in the test device can functionally be divided into two parts: the actual JTAG testing and the software related to its operation, i.e. the software BSSW controlling the boundary scan testing and the JTAG controller C, and as the second part the software A(up) related to the adaptation required by the asynchronous transmission path. The pieces of software related directly to JTAG testing comprise several functions. A boundary-scan description language BSDL is typically used to describe various testing situations and to define the components to be JTAG-tested. BSDL descriptions for each tested circuit and its components are also stored in the memory of the computer. The software BSSW controlling the boundary scan testing feeds test data formed on the basis of these BSDL descriptions through the interface C(I/F) to the JTAG controller C, which in turn controls the JTAG-tested components by means of test data signals TDI, TMS, and TCK. Boundary scan cells BSC in known JTAG controllers, which are generated from shift registers and through which test data TDI is directed with an incoming clock signal TCK and test mode select signal TMS, can thus preferably be replaced by a programmatic test data generation function.

The driver of the interface C(I/F) between the software BSSW controlling the boundary scan testing and the JTAG controller C is preferably re-configurable, whereby, due to the modularity of the software, it is, if necessary, possible to replace the JTAG controller C implemented by software with a prior-art JTAG controller that is at least partly implemented by components. In such a case, only the driver of the interface C(I/F) needs to be reconfigured.

The software A(up) related to the adaptation required by the asynchronous transmission path synchronizes the test data and generates the required delays to the test data TDO received from the device under test DUT. In synchronizing the test data, the clock signal TCK is preferably not transmitted to the device under test DUT, but the clock signal is generated in the downlink transceiver on the basis of the received test mode select signal TMS and test data input TDI. A delay is always generated in a signal on the asynchronous transmission path, whereby an exact timing between the JTAG controller and the generated clock signal is naturally lost, but bit-specific synchronization of the transmitted signals TMS and TDI in relation to the clock signal is maintained. The test mode select signal TMS and the test data input TDI are compressed in step with the clock signal TCK in such a manner that during transmission, the samples remain unbroken in relation to the time domain. This is typically performed on the rising edge of the clock signal, in which case one clock signal cycle is depicted by a two-bit representation that comprises the values of the signals TMS and TDI at the rising edge of the clock signal.

Correspondingly, a test data signal coming from the transmission path is received in the transceiver, after which the actual test data TDO is separated from the higher-level data transmission protocol used on the transmission path by using the software A(up). The software A(up) further generates the necessary synchronous delay for the test data TDO in such a manner that the TDO signal forwarded to the TAP interface defined by software is in accordance with the interface definition in synch with the test data input TDI. Delays generated on the transmission path especially when using higher clock signal frequencies have as a result that to achieve the synchronization required by the TAP interface, the uplink adaptation software A(up) has to generate a delay for the received test signal TDO before taking the test signal TDO to the TAP interface. If the transmission path delay in one direction was shorter than half of the used clock signal cycle, the received test signal TDO could be synchronized with the TAP interface without any special arrangements. In practice, short delays of this kind cannot always be achieved especially on higher clock frequencies.

It is therefore essential that the uplink adaptation software A(up) is arranged to generate a suitable delay for the received test signal TDO before the TDO signal is transmitted to the JTAG controller. According to a preferred embodiment of the invention, this can be done using a virtual boundary scan cell chain by attaching to the boundary scan cell chain of the device under test DUT an extra, "virtual" boundary scan cell chain that is implemented to the uplink adaptation software A(up). When this "virtual" boundary scan cell chain is added to the BSDL description of the device under test DUT, the entire boundary scan cell chain seems to the JTAG controller to be longer than it actually is, whereby the transmission of the actual TDO signal is delayed long enough so that the transmission path delay can be compensated for.

Theoretically, the "virtual" boundary scan cell chain is implemented in such a manner that a new "virtual" circuit with n boundary scan cells is added to the end of the scan chain in the BSDL description of the device under test DUT, whereby the transmission of the TDO signal to the TAP interface is delayed long enough so that the transmission path delays can be compensated for and the TDO signal can be transmitted to the TAP interface in synch with the TDI signal. The number of boundary scan cells in the virtual circuit, in other words, the value of variable n, can preferably be defined separately for each test situation, in which case the delays generated in the protocol adaptation required by the transmission protocol are to be taken into account in the definition of the value of variable n as transmission path delays and in the TAP-interface synchronization of the TDO signal. During testing, situations may also occur, in which test data also needs to be buffered in the device under test, which should also be taken into account as a delay. The variation of the delays generated on the asynchronous transmission path can also be taken into account in the definition of the value of variable n, in which case the value of variable n can preferably be set slightly higher than what the sum of the above-mentioned delays requires.

According to a preferred embodiment, the delay provided by the virtual circuit can be implemented by means of the adaptation software A(up) with a programmed counter, the value of which is incremented in step with the clock signal. The test data output TDO from the device under test is buffered until the counter value reaches a defined value n, at which time the buffered TDO data is allowed on the TAP interface. Alternatively, the generation of the delay can be implemented by programming with the BSDL software of the test equipment to the existing circuits and their components extra execution commands that in actuality are null operators, in which during the clock cycle, the data is only processed by transferring it to the next cell. Defining n null operators to the boundary scan cell chain also creates a situation, in which the JTAG controller assumes that the boundary scan cell chain is longer than it actually is, whereby the system delays can be compensated for and the synchronization required by the TAP interface can be ensured.

The above solutions for the compensation of delays are based on generating a delay in the received TDO signal. In view of the implementation of the invention, delay compensation can, however, be arranged to take place at any point of the JTAG test loop. According to a preferred embodiment, if the entire test equipment is implemented by software, delay generation can be done by software at a higher level, in other words, with the BSSW software of the test equipment, because the JTAG test signals then need not be in synch on the TAP interface. In such a case, to compensate for the delay, it is possible to modify the test data by software and to thus shift the starting point of the analysis. Therefore, the manner in which a delay is generated in the TDO signal for synchronization is not relevant for the implementation of the invention; the essential thing is that the JTAG test equipment is made to assume that the boundary scan cell chain is longer than is actually is.

Said asynchronous transmission path may be wireless or wired; the essential thing is to adapt the test data, preferably simultaneous test data sets from several testing processes, to such a format suitable for the transmission path that the device under test DUT can open the signals in a format according to the TAP interface definition. The actual transceiver is a transmission path-specific transceiver that is thus dependent on the physical implementation of the transmission path, typically also on the implementation of the transmission path protocol. An Ethernet network card known per se can be used as the transceiver in this example. The task of the transceiver is typically the transmission and reception of the test data, protocol adaptation, possible encryption and decryption, and data integrity management.

The testing arrangement of the invention preferably does not require changes to the operation of the downlink adapter A(down) and the transceiver TR2 used with the device under test DUT.

It is apparent to a person skilled in the art that while the technology advances, the basic idea of the invention can be implemented in many different ways. The invention and its embodiments are thus not restricted to the examples described above, but can vary within the scope of the claims.

The invention claimed is:

1. IEEE 1149.1-2001 test equipment configured to establish an asynchronous data transmission connection with an IEEE 1149.1-2001-compatible device under test for the transmission of test data between test access ports in said test equipment and device under test, the test data being at reception arranged to be synchronized before said test access ports, wherein said test equipment comprises:

Means implemented as a computer program for adapting at least one test data sequence arriving in the format defined by said test access port for transmission on an asynchronous transmission path;

A transceiver for adapting said at least one test data sequence and transmitting it through the asynchronous data transmission connection to the device under test.

2. The test equipment as claimed in claim 1, wherein said means for adapting the test data sequence for transmission to the asynchronous transmission path are implemented as a modular program, in addition to which said test equipment comprises:

Means implemented as a modular program for controlling IEEE 1149.1-2001 testing and for analyzing the received test data sequence; and Means implemented as a modular program for generating an IEEE 1149.1-2001 test data sequence.

3. The test equipment as claimed in claim 2, further comprising:

An interface between said means implemented as a modular program for controlling the IEEE 1149.1-2001 testing and for analyzing the received test data sequence and said means implemented as a modular program for generating the IEEE 1149.1-2001 test data sequence is configured to be reconfigurable.

4. The test equipment as claimed in claim 1, wherein said means implemented as a computer program comprise program means for generating a delay in the test data received from the device under test to achieve said test access port synchronization, the delay-generating means being configured to program a required delay in a description of the device under test if the test equipment in such a manner that the test equipment assumes the testing of the device under test to last longer that the actual configuration of the device under test requires.

5. The test equipment as claimed in claim 2, wherein the means implemented as a module program for controlling IEEE 1149.1-2001 testing and for analyzing the received test data sequence comprise program means for generating delay and analysis means responsive thereto.

6. The test equipment as claimed in claim 1, wherein said test equipment is arranged to run several test processes at the same time, whereby said means implemented as a computer program are configured to adapt several test data sequences for simultaneous transmission on the asynchronous transmission path.

7. IEEE 1149.1-2001 testing system comprising IEEE 1149.1-2001test equipment and an IEEE 1149.1-2001-compatable device under test that are configured to establish together an asynchronous data transmission connection for transmitting test data between test access ports of said test equipment and device under test, the test data being at reception configured to be synchronized before said test access ports, wherein said test equipment comprises:

Means implemented as a computer program for adapting at least one test data sequence arriving in the format defined by said test access port for transmission on an asynchronous transmission path, and A transceiver for adapting said at least one test data sequence and transmitting it through the asynchronous data transmission connection to the device under test.

* * * * *